United States Patent [19]

Muraoka et al.

[11] Patent Number: 5,826,601
[45] Date of Patent: Oct. 27, 1998

[54] TREATING LIQUID REPLACING METHOD, SUBSTRATE TREATING METHOD AND SUBSTRATE TREATING APPARATUS

[75] Inventors: Yusuke Muraoka, Shiga; Tutomu Takeuchi, Kyoto, both of Japan

[73] Assignee: Dainippon Screen Mfg., Co., Kyoto, Japan

[21] Appl. No.: 622,117

[22] Filed: Mar. 26, 1996

[30] Foreign Application Priority Data

Mar. 30, 1995 [JP] Japan ................................. 7-100126

[51] Int. Cl.⁶ ............................ C03C 23/00; B08B 5/00; B08B 3/00; B08B 9/20
[52] U.S. Cl. ............................... 134/2; 134/11; 134/95.2; 134/25.4; 134/102.1
[58] Field of Search ............................... 134/11, 2, 95.2, 134/25.4, 102.1, 103.1

[56] References Cited

U.S. PATENT DOCUMENTS 3,848,187  11/1974  Rohrback et al. ................. 324/65 CR
5,520,744   5/1996  Fujikawa et al. ......................... 134/11

*Primary Examiner*—Lynette F. Smith
*Attorney, Agent, or Firm*—Ostrolenk, Faber, Gerb & Soffen, LLP

[57] ABSTRACT

A treating liquid first in a treating bath is replaced with a second treating liquid by supplying the second treating liquid to an upper position of the treating bath while discharging the first treating liquid from a lower position of the treating bath. The replacement is effected with a balance maintained between a quantity of the first treating liquid discharged and a quantity of the second treating liquid supplied. With this method, the first treating liquid in the treating bath is replaceable with a reduced quantity of the second treating liquid. This treating liquid replacing method allows a substrate to be treated efficiently with a plurality of treating liquids in one treating bath.

12 Claims, 9 Drawing Sheets

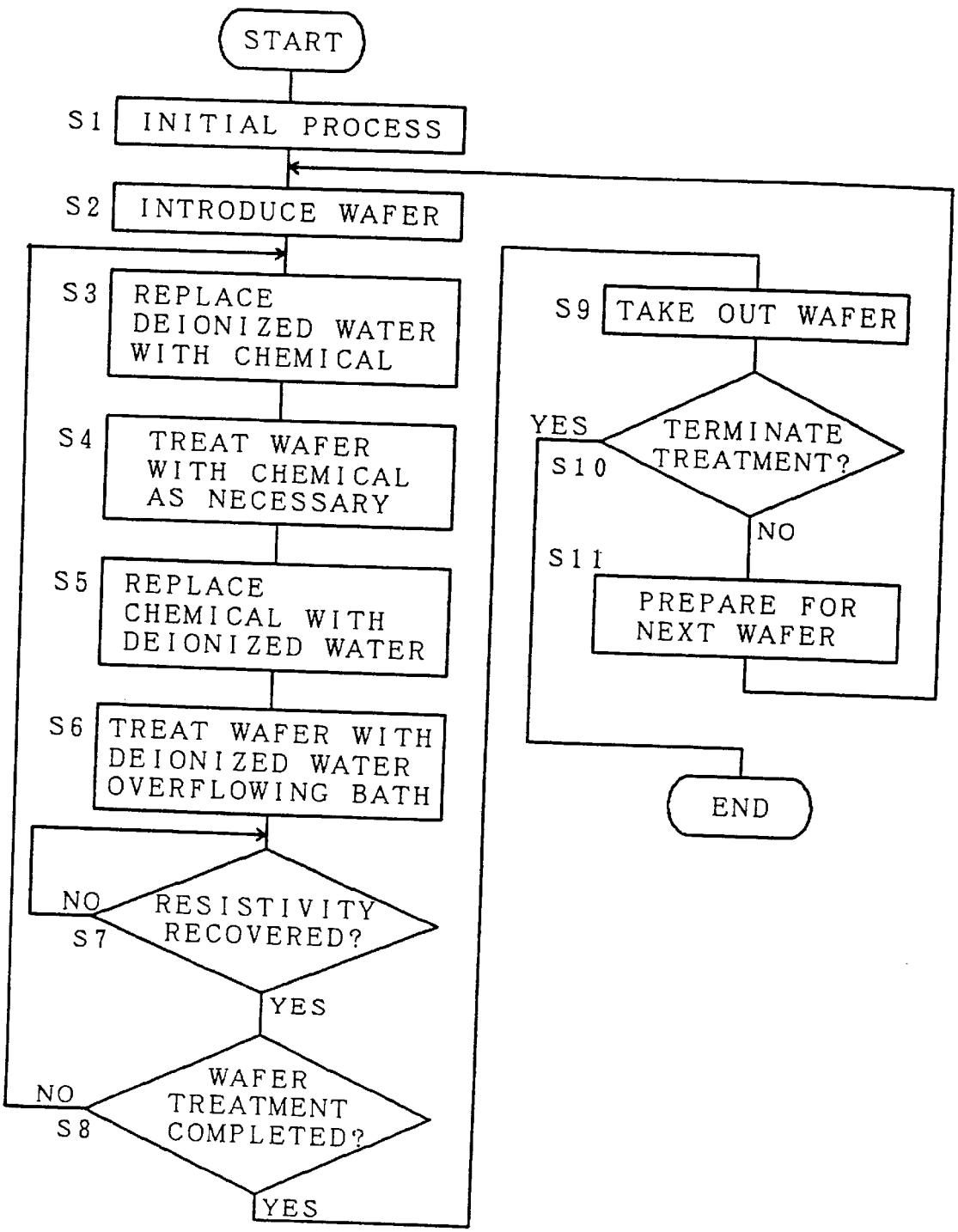

TREATING LIQUID REPLACING METHOD, SUBSTRATE TREATING METHOD AND SUBSTRATE TREATING APPARATUS

BACKGROUND OF THE INVENTION

(1) Field of the Invention

The present invention relates to substrate treating apparatus for treating semiconductor wafers, glass substrates for liquid crystal displays, masks, reticles and the like (hereinafter referred to as "substrates") in piecemeal processing or batch processing. More particularly, the invention relates to a treating liquid replacing method for replacing one type of treating liquid in a substrate treating bath with another type of treating liquid, a substrate treating method utilizing the treating liquid replacing method, and a substrate treating apparatus suited for executing the treating liquid replacing method and substrate treating method.

(2) Description of the Related Art

In this type of substrate treating apparatus, a substrate is treated by being immersed in a treating liquid stored in a treating bath, and is raised from the treating liquid after treatment. Particles of dust floating on the surface of the treating liquid in the treating bath, if any, would adhere to the substrate when the latter is raised, which is undesirable. Thus, the conventional apparatus treats substrates in an overflow mode in order to eliminate such particles from the liquid surface. That is, during treatment of a substrate, a treating liquid is supplied into the treating bath through a treating liquid supply pipe connected to the bottom of the treating bath. The treating liquid overflowing the treating bath is discharged through an overflow passage provided in an upper position of the treating bath. Particles floating on the liquid surface in the treating bath are removed efficiently along with the treating liquid discharged through the overflow passage.

This type of substrate treating apparatus is sometimes used to treat a substrate with different types of chemicals (treating liquids) successively. In such a case, for example, the substrate is treated with liquids supplied in the order of a first chemical, deionized water (which is one of the treating liquids), a second chemical (different from the first chemical), deionized water, a third chemical (different from the first and second chemicals), deionized water, and so on. The treatment with each treating liquid is performed in the overflow mode.

Where each treating liquid is supplied into a separate treating bath, the substrate treated with one treating liquid must be transported to a different treating bath for treatment with another treating liquid. During the transport, the substrate contacts the atmosphere, resulting in the inconvenience that particles floating in the atmosphere or those generated from transport robots adhere to the substrate.

There is also a known type of apparatus constructed to carry out treatment in a single treating bath, in which a treating liquid (first treating liquid) in the treating bath is replaced with a next treating liquid (second treating liquid) so that the substrate under treatment remains out of contact with the atmosphere. This known apparatus also treats the substrate with each treating liquid in the overflow mode. Switching is made among different types of chemicals and deionized water to be supplied through a treating liquid supply pipe connected to the bottom of the treating bath. The second treating liquid supplied through the supply pipe connected to the bottom of the treating bath causes the first treating liquid to overflow from the top of the treating bath and to be discharged through an overflow passage. In this way, replacement of the treating liquids is achieved.

In such a conventional system, a boundary plane between the first treating liquid in the treating bath and the second treating liquid suppled to the bottom of the treating bath should ideally rise in a horizontal state. Then, the second treating liquid forces the first treating liquid over the top and out of the bath, thereby replacing the first treating liquid.

Actually, however, the liquid replacement is not effected in the ideal state noted above. For the treating liquid supply pipe in the bottom of the treating bath defines a plurality of treating liquid supply bores, and the treating liquids (e.g. the second treating liquid) are supplied through these bores. This construction, combined with the substrate and a substrate holder (e.g. a cassette used in batch processing) presenting obstacles, produces turbulence of the second treating liquid supplied into the treating bath. There also occur dead spaces which are detrimental to the smooth flow of the second treating liquid supplied to the bottom of the treating bath.

An experiment has been conducted to replace one treating liquid with another, using the conventional treating liquid replacing method. It has been found that the second treating liquid is required (i.e. has to be supplied) in a quantity equal to 3 to 10 times the capacity of the treating bath to completely replace the first treating liquid in the treating bath completely.

Thus, the conventional method of replacing treating liquids consumes large quantities of treating liquids (various chemicals and deionized water), resulting in high operating cost.

SUMMARY OF THE INVENTION

The present invention has been developed with regard to the state of the art noted above, and its object is to provide a treating liquid replacing method which enables one type of treating liquid to be replaced with another type of treating liquid supplied in a reduced quantity, a substrate treating method utilizing this treating liquid replacing method, and a substrate treating apparatus suited for executing the treating liquid replacing method and substrate treating method.

The above object is fulfilled, according to the present invention, by a treating liquid replacing method for replacing a first treating liquid stored in a treating bath for treating a substrate, with a second treating liquid, the method comprising:

supplying the second treating liquid to an upper position of the treating bath while discharging the first treating liquid stored in the treating bath from a lower position of the treating bath, the first treating liquid being discharged and the second treating liquid being supplied with a balance maintained between a quantity of the first treating liquid discharged and a quantity of the second treating liquid supplied, thereby to replace the first treating liquid with the second treating liquid.

With this treating liquid replacing method, the first treating liquid in the treating bath of the substrate treating apparatus is replaced with the second treating liquid by supplying the second treating liquid to the upper position of the treating bath while discharging the first treating liquid from the lower position of the treating bath. Thus, the first treating liquid is replaced by utilizing gravitational downflows of the treating liquids in the treating bath. This method suppresses turbulence of the treating liquids in the treating bath due to obstructions by the substrate and a substrate holder or cassette, such turbulence being encountered in the prior art where treating liquid replacement is performed in an upward flow mode counter to gravity. This method also diminishes dead spaces detrimental to smooth flows of the second treating liquid. Consequently, the first treating liquid is replaced with the second treating liquid smoothly, thereby requiring a reduced quantity of the second treating liquid newly supplied as a replacement, and lowering running cost.

Further, the first treating liquid is discharged and the second treating liquid supplied with a balance maintained between a quantity of the first treating liquid discharged and a quantity of the second treating liquid supplied. This feature is effective to avoid inconveniences occurring during the treating liquid replacement, such as lowering of the liquid level in the treating bath to expose the substrate in the treating bath to the atmosphere, or rising of the liquid level resulting in the treating liquid overflowing the top of the treating bath.

A balance may be maintained between the quantity of the first treating liquid discharged and the quantity of the second treating liquid supplied, by monitoring a liquid level in the treating bath while the second treating liquid is replacing the first treating liquid. Then, at least either the quantity of the first treating liquid discharged or the quantity of the second treating liquid supplied may be controlled to maintain the liquid level at a predetermined standard level.

The treating liquids (first treating liquid and second treating liquid) include one of various types of chemicals, and deionized water. In the above method, when a chemical is replaced with deionized water, the first treating liquid comprises the chemical and the second treating liquid deionized water. When deionized water is replaced with a chemical, the first treating liquid comprises deionized water and the second treating liquid the chemical.

A substrate treating method employing the above treating liquid replacing method, according to the present invention, is intended for treating a substrate immersed in a treating liquid. This substrate treating method comprises:

supplying a second treating liquid to an upper position of a treating bath while discharging, from a lower position of the treating bath, a first treating liquid stored in the treating bath in which the substrate is immersed, the first treating liquid being discharged and the second treating liquid being supplied with a balance maintained between a quantity of the first treating liquid discharged and a quantity of the second treating liquid supplied, thereby to replace the first treating liquid with the second treating liquid, the substrate being subsequently treated with the second treating liquid.

With this method, the substrate is treated with the second treating liquid while the first treating liquid in the treating bath is replaced efficiently with the second treating liquid. During the treating liquid replacement, the second treating liquid is in downflow state, and the substrate is treated also with the second treating liquid flowing downward. This substrate treating method, when executed in the following specific mode, produces a further enhanced effect.

When the second treating liquid comprises a chemical, the second treating liquid may be supplied to the upper position of the treating bath and discharged from the lower position of the treating bath, after the first treating liquid is replaced with the second treating liquid, to treat the substrate with the second treating liquid in the downflow mode for a predetermined time. Thus, the chemical contaminated after the treatment is discharged from the lower position of the treating bath, to enhance the effect of treatment.

Further, when the second treating liquid comprises a chemical, supply and discharge of the second treating liquid may be stopped for a predetermined time, after the first treating liquid is replaced with the second treating liquid, to treat the substrate with the second treating liquid as immersed in the second treating liquid.

When the second treating liquid comprises deionized water, the second treating liquid may be supplied to the lower position of the treating bath and discharged from the upper position of the treating bath, after the first treating liquid is replaced with the second treating liquid, to treat the substrate with the second treating liquid in overflowing state. It is desirable that the deionized water used for treating the substrate has low oxygen concentration. Even where substrate treatment is conducted in atmospheric condition, surface portions of the deionized water contacting the atmosphere are discharged from the upper position of the treating bath since the substrate is treated with deionized water in overflowing state as described above. Thus, oxygen does not easily dissolve in the deionized water in the treating bath, allowing an effective substrate treatment with deionized water.

After completing the treatment of the substrate with the treating liquid stored in the treating bath and before raising the substrate from the treating bath, deionized water may be supplied to the lower position of the treating bath and discharged from the upper position of the treating bath so that the deionized water is in overflowing state. The substrate may be raised from the treating bath while the deionized water is in the overflowing state. With the deionized water overflowing the treating bath, particles and the like floating on the water surface and oxygen-laden part of the deionized water are discharged from the upper position of the treating bath. By raising the substrate in such condition, particles and the like are restrained from adhering to the substrate adjacent the water surface.

The substrate may be treated with a plurality of different chemicals based on a recipe. In this case, the substrate is treated with deionized water after treatment with each of the chemicals. Each chemical acts as the first treating liquid replaced with the deionized water acting as the second treating liquid. The replacement is effected by supplying the deionized water to the upper position of the treating bath and discharging each chemical from the lower position of the treating bath. The deionized water, now acting as the first treating liquid, is replaced with each chemical, acting as the second treating liquid, by supplying the chemical to the upper position of the treating bath and discharging the deionized water from the lower position of the treating bath. In this way, a series of substrate treatments with different types of chemicals and deionized water may be implemented in a single treating bath while replacing the treating liquids efficiently.

In carrying out the series of substrate treatments with different types of chemicals and deionized water, the resistivity of the deionized water discharged from the treating bath may be monitored at least during a final treatment with deionized water. Then, the final treatment with deionized water is terminated under a control based on a level of the resistivity. In the presence of particles washed off the substrate, the resistivity of the deionized water discharged from the treating bath is low, indicating that the treatment is insufficient. By continuing the substrate treatment with deionized water until recovery of the resistivity of the deionized water as noted above, the substrate treatment may be terminated only upon confirmation of sufficient treatment being provided, thereby to assure increased precision of substrate treatment. For example, the substrate may be treated with liquids supplied in the order of a first chemical, deionized water, a second chemical, deionized water, a third chemical and deionized water. In this case, the substrate is finally treated with deionized water after treatment with the third chemical. However, a treatment with deionized water following a treatment with each chemical may be continued until recovery of the resistivity of the deionized water. In the latter case, the substrate treatment may be performed while confirming that each chemical has been washed away by the deionized water used in the treatment following the treatment with that chemical.

The treating bath may be mounted in a closed chamber, so that replacement of the treating liquid and treatment of the substrate are carried out while the closed chamber is filled with an inert gas. In this case, unlike where replacement of the treating liquid and treatment of the substrate are carried out in atmospheric condition, oxygen does not dissolve in deionized water during treatment with the deionized water, for example. Thus, the entire substrate treatment, including treatment with deionized water, and replacement of the treating liquid, may be performed in the downflow mode.

Where substrate treatment is carried out in an inert gas atmosphere, with deionized water acting as the second treating liquid, oxygen concentration in the closed chamber may be measured after the first treating liquid is replaced with the second treating liquid. If the oxygen concentration measured is at or above a predetermined level, the treating liquid may be supplied to the lower position of the treating bath and discharged from the upper position of the treating bath, to treat the substrate with the second treating liquid in overflowing state. This measure can cope with impairment of the inert gas atmosphere.

The treating bath may be mounted in a decompressible closed chamber defining a space above the treating bath for drying the substrate raised from the treating bath with an organic solvent vapor. In this case, the substrate is raised from the treating bath while the organic solvent vapor is supplied into the closed chamber, after the substrate is treated as immersed in the treating liquid stored in the treating bath. Subsequently, supply of the organic solvent vapor is stopped and the closed chamber is decompressed, to effect drying treatment of the substrate. This effectively avoids the inconvenience of forming water marks on the surface of the treated substrate, to assure substrate treatment performed with high precision.

In a further aspect of the present invention, there is provided a substrate treating apparatus suited for executing the above treating liquid replacing method and substrate treating method. This apparatus, having a treating bath for treating a substrate immersed in treating liquids, comprises:

- an upper treating liquid supply device for supplying a treating liquid to an upper position of the treating bath;
- an upper treating liquid discharge device for discharging a treating liquid from the upper position of the treating bath;
- a lower treating liquid supply device for supplying a treating liquid to a lower position of the treating bath; and
- a lower treating liquid discharge device for discharging a treating liquid from the lower position of the treating bath.

With this apparatus, while the lower treating liquid discharge device discharges a treating liquid from the treating bath, the upper treating liquid supply device supplies a different treating liquid to the treating bath, thereby executing the efficient treating liquid replacing method according to the present invention described above. This state may be maintained or continued to treat the substrate in the downflow mode. When the lower treating liquid supply device supplies a treating liquid which overflows the upper position of the treating bath, the upper treating liquid discharge device discharges the treating liquid, thereby effecting substrate treatment in the overflow mode. By treating the substrate with deionized water in overflowing state, the substrate treatment may be effected with a reduced quantity of oxygen dissolved in the deionized water. Further, the substrate may be raised from the treating bath while deionized water is overflowing the treating bath, thereby to avoid adhesion of particles to the substrate adjacent the water surface. These features assure substrate treatment performed with high precision.

The upper treating liquid discharge device and the upper treating liquid supply device may comprise an overflow passage disposed adjacent the upper position of the treating bath for allowing the treating liquid to flow into and out of the treating bath, and a first switching device for switching between discharge of the treating liquid spilling from the treating bath to the overflow passage and inflow of the treating liquid from the overflow passage to the treating bath. The lower treating liquid discharge device and the lower treating liquid supply device may comprise a drain/supply pipe connected to the lower position of the treating bath, and a second switching device for switching between discharge of the treating liquid from the treating bath to the drain/supply pipe and inflow of the treating liquid from the drain/supply pipe to the treating bath. These features provide a simplified construction of the apparatus.

The apparatus may further comprise a level detecting device for detecting a level of the treating liquid in the treating bath, and a flow control device for controlling, based on the level detected, at least either a quantity of the treating liquid discharged from the treating bath or a quantity of the treating liquid supplied to the treating bath to maintain a predetermined level. With this construction, the liquid level may be controlled to be the predetermined level in real time while detecting the liquid level in the treating bath. For example, the treating liquid replacement may be carried out while controlling the liquid level to be constant. Consequently, the inconveniences of the substrate contacting the atmosphere and the treating liquid overflowing the upper position of the treating bath may be avoided with greater assurance.

The apparatus may further comprise a resistivity measuring device for detecting a resistivity of deionized water acting as the treating liquid discharged from the treating bath, and a control device for controlling, based on the resistivity measured, at least termination of a final treatment of the substrate with the deionized water. Then, the substrate treatment may be terminated upon confirmation that the substrate has been treated with deionized water sufficiently.

The apparatus may also comprise a closed chamber for accommodating the treating bath, and an inert gas supplying device for filling the closed chamber with an inert gas. Then, the substrate treatment and treating liquid replacement may be carried out in an inert gas atmosphere. This eliminates the inconvenience of oxygen dissolving in deionized water used in the substrate treatment, to assure the substrate treatment performed with high precision.

The apparatus having the closed chamber and inert gas supply device may further comprise an oxygen concentration measuring device for measuring oxygen concentration in the closed chamber, and a control device for discharging a chemical acting as a first treating liquid from the lower position of the treating bath, and supplying deionized water acting as a second treating liquid to the upper position of the treating bath, to replace the chemical with the deionized water, if the oxygen concentration measured is at or above a predetermined level. Deionized water is thereafter supplied to the lower position of the treating bath and discharged from the upper position of the treating bath, to treat the substrate with the deionized water in overflowing state. This construction restrains oxygen from dissolving in deionized water during the substrate treatment with the deionized water even if the inert gas atmosphere is impaired.

The apparatus may comprise a decompressible closed chamber for accommodating the treating bath and defining a space above the treating bath for drying the substrate raised from the treating bath with an organic solvent vapor, an organic solvent vapor supplying device for filling said closed chamber with the organic solvent vapor, and a control device for raising the substrate while supplying the organic solvent vapor, after the substrate is treated with the treating liquid, and subsequently stopping supply of the organic solvent vapor and decompressing the closed chamber, thereby to effect drying treatment of the substrate. With this construction, the treating bath is mounted in the closed chamber, and the organic solvent vapor is filled into the closed chamber, after the substrate is treated as immersed in the treating liquid stored in the treating bath. Then, the substrate is raised into an atmosphere of the organic solvent vapor to be dried therein. This effectively avoids the inconvenience of forming water marks on the surface of the treated substrate, to assure substrate treatment performed with high precision.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

FIG. 3 is a flowchart showing a sequence of substrate treatment in the first embodiment;

DETAILED DESCRIPTION OF THE PREFERRED EMBODIMENTS

Preferred Embodiments of the present invention will be described in detail hereinafter with reference to the drawings.

First Embodiment

Figure 1:
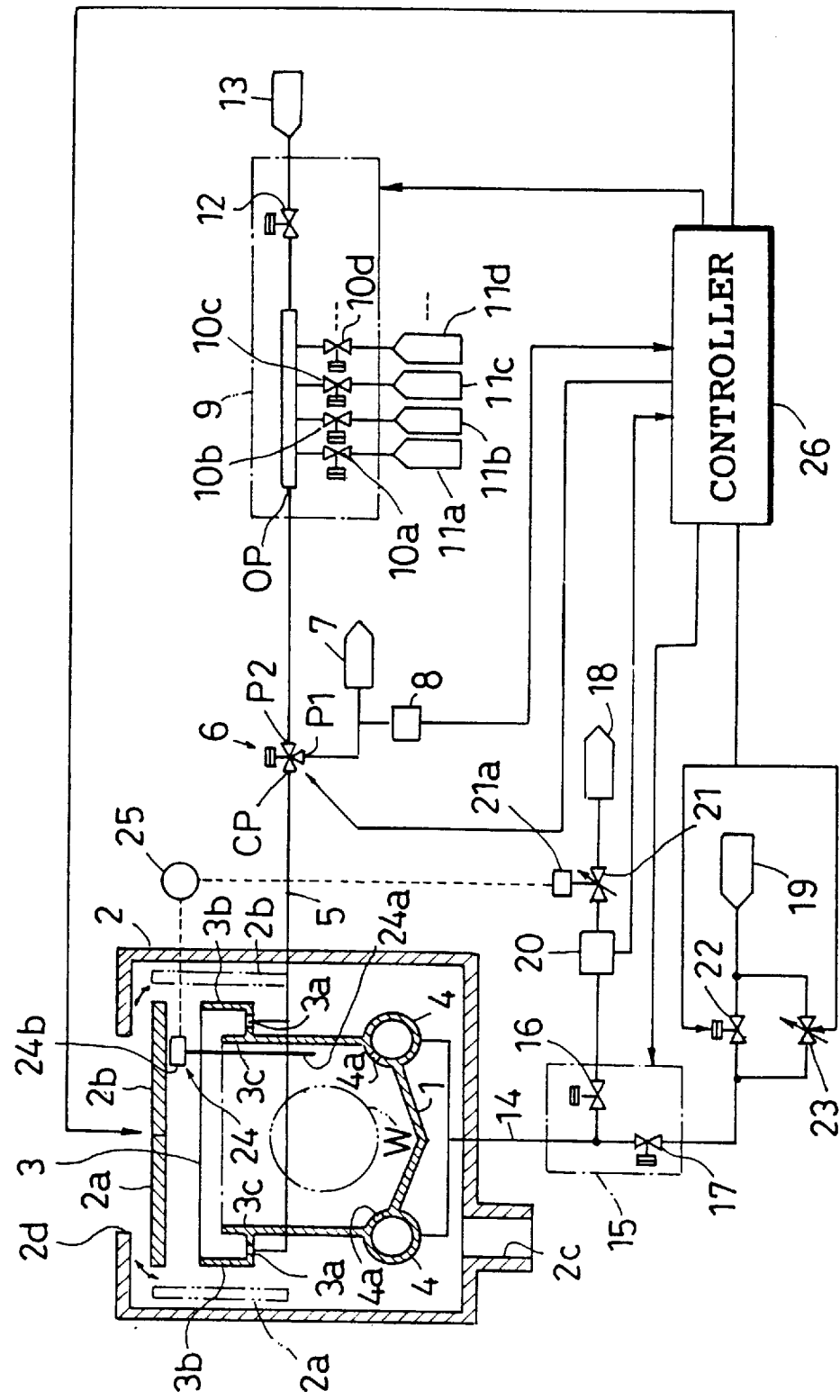
FIG. 1 is a schematic overall view of a first embodiment of a substrate treating apparatus of the present invention.
Figure 2:
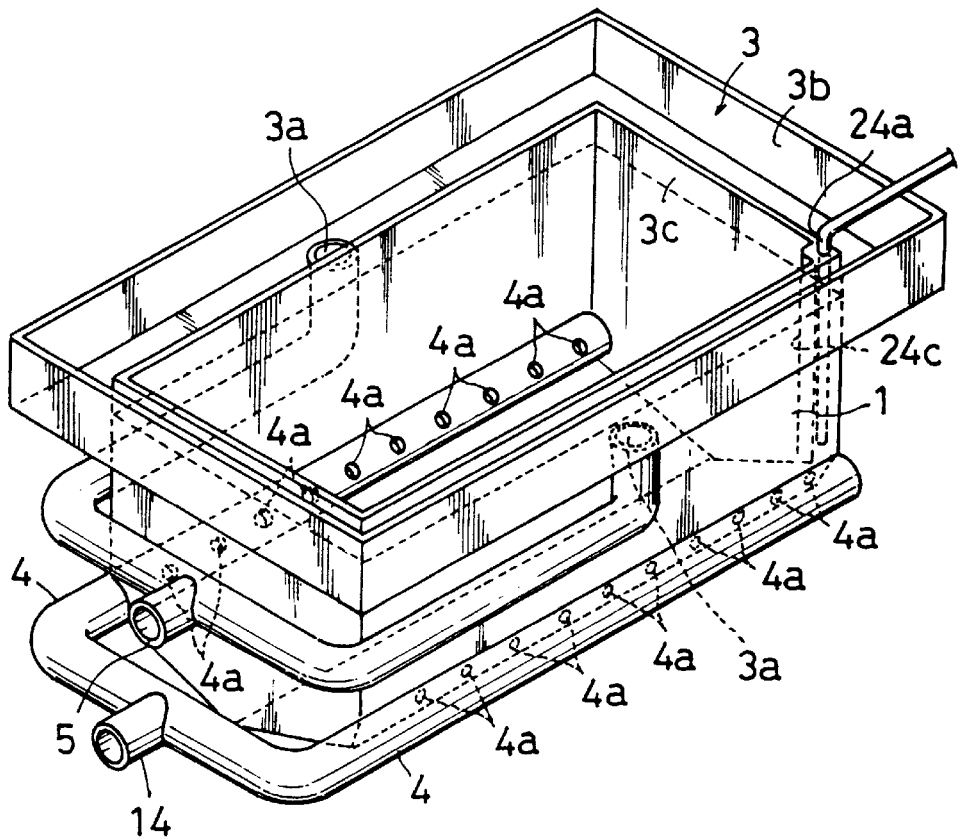
FIG. 2 is a perspective view of a treating bath.

FIG. 1 is a schematic overall view of a substrate treating apparatus in a first embodiment of the present invention. FIG. 2 is a perspective view of a treating bath. In FIG. 1, the treating bath is shown in vertical cross-section.

In this embodiment, a treating bath 1 is mounted in an open chamber 2. The chamber 2 includes a pair of auto covers 2a and 2b movable between open and closed positions above the treating bath 1, respectively, and an exhaust pipe 2c connected to a bottom position of the chamber 2. When the auto covers 2a and 2b are opened as shown by phantom lines in FIG. 1, a substrate or wafer W is introduced into the treating bath 1 through an upper opening 2d of the chamber 2 by a transport robot, not shown. The wafer W, supported by a wafer holder (not shown), is treated in the treating bath 1. The chamber 2 is not sealed gas-tight, and hence wafer treatment is performed in atmospheric conditions.

The treating bath 1 includes an overflow passage 3 formed on an upper portion thereof for allowing treating liquids to flow into and out of the treating bath 1. The treating bath 1 further includes a drain/supply pipe 4 communicating with lower positions thereof.

The overflow passage 3 guides a treating liquid overflowing the treating bath 1 into a pipe 5 through bores 3a. The overflow passage 3 also receives a treating liquid from the pipe 5 through the bores 3a, and allows this treating liquid to flow into the treating bath 1. The overflow passage 3 has outer walls 3b formed higher than inner walls 3c, so that the treating liquid supplied to the overflow passage 3 flows into the treating bath 1 instead of spilling over the outer walls 3b of the overflow passage 3.

The pipe 5 extending from the overflow passage 3 is connected to a common port CP of a three-way valve 6. The three-way valve 6 has a port P1 connected to a drain 7. When the common port CP is placed in communication with the port P1, the treating liquid overflowing the treating bath 1 is drained through the overflow passage 3 and pipe 5 into the drain 7. This drain line includes a resistivity meter 8 for detecting resistivity of the treating liquid discharged to the drain 7.

The three-way valve 6 further includes a port P2 connected to an output port OP of an integrated mixing valve 9. A plurality of chemical sources 11a–11d are connected to the mixing valve 9 through switch valves 10a–10d for individually supplying various chemicals (e.g. HCl, $H_2O_2$, $NH_4OH$ and HF) to the output port OP. While four chemical sources are shown in FIG. 1 by way of example, the number thereof is dependent on the number of different chemicals used. Further, a deionized water source 13 is connected to the mixing valve 9 through a switch valve 12. By appropriately operating the switch valves 10a–10d and 12, a selected one of the chemicals or deionized water is supplied to the output port OP of mixing valve 9.

When the common port CP and port P2 of three-way valve 6 are placed in communication with each other, the chemical or deionized water supplied to the output port OP of mixing valve 9 is supplied to the treating bath 1 through the pipe 5 and overflow passage 3.

The drain/supply pipe 4 connected to the bottom of the treating bath 1 receives a treating liquid drawn from the treating bath 1 through a plurality of bores 4a, and allows the treating liquid to flow into a pipe 14. The drain/supply pipe 4 also allows a treating liquid to be supplied from the pipe 14 into the treating bath 1 through the bores 4a.

The pipe 14 extending from the drain/supply pipe 4 is connected to an integrated switch valve 15. The integrated switch valve includes two switch valves 16 and 17. By appropriately operating the switch valves 16 and 17, the pipe 14 may be connected to a drain 18 or to a deionized water source 19 which will be described hereinafter.

The drain 18 is connected to the switch valve 16 through a chemical concentration monitor 20, and a flow control valve 21 operable by a motor 21a. When the switch valve 16 is opened and the switch valve 17 is closed, the treating liquid in the treating bath 1 is drawn therefrom through the drain/supply pipe 4 and the pipe 14 into the drain 18.

The switch valve 17 is connected to the deionized water source 19 through a switch valve 22 and a flow control valve 23 arranged in parallel. When the switch valve 16 is closed and the switch valve 17 opened, deionized water is supplied from the deionized water source 19 to the treating bath 1 through the pipe 14 and drain/supply pipe 4. When the switch valve 22 is opened at this time, deionized water is supplied to the treating bath 1 in a quantity required for normal wafer treatment in an overflow condition. On the other hand, when the switch valve 22 is closed, the flow control valve 23 lowers the flow rate of deionized water whereby the deionized water is supplied to the treating bath 1 at a minimum required flow rate.

The treating bath 1 further includes a level sensor 24. This sensor 24 has a tube 24a immersed in the treating liquid in the treating bath 1. The tube 24a defines bores (not shown) for delivering nitrogen ($N_2$) gas into the treating liquid. A pressure sensor 24b detects a pressure for delivering the nitrogen gas, a liquid level being determined from the pressure detected. The tube 24a is surrounded by a sleeve 24c (FIG. 2) and set apart from the wafer W, in order that bubbles of the nitrogen gas delivered from the tube 24a would not affect wafer treatment. The level sensor 24 may, for example, comprise a capacitance sensor disposed at a predetermined level in the treating bath 1 for detecting presence or absence of a treating liquid to determine a liquid level.

Based on information from the level sensor 24, a level controller 25 drives the motor 21a to adjust a rate of flow through the flow control valve 21. Consequently, the treating liquid in the treating bath 1 is maintained at a level (standard level) shown in a dot-and-dash line in FIG. 1.

When a treating liquid is supplied to the treating bath 1 through the overflow passage 3 in a larger quantity than a discharge from the treating bath 1 through the drain/supply pipe 4 to the drain 18, the liquid level would rise and the treating liquid would eventually overflow from the outer walls 3b of overflow passage 3. At this time, the flow control valve 21 may be operated to allow an increased rate of flow therethrough, so that the treating liquid may be drawn off in an increased quantity through the drain/supply pipe 4. This operation secures a balance between the treating liquid supply through the overflow passage 3 and the treating liquid discharge through the drain/supply pipe 4.

Conversely, when a treating liquid is supplied through the overflow passage 3 in a smaller quantity than a discharge through the drain/supply pipe 4, the liquid level would lower and the wafer W in the treating bath 1 would eventually contact the atmosphere. At this time, the flow control valve 21 may be operated to allow a decreased rate of flow therethrough, thereby to establish a balance between the treating liquid supply through the overflow passage 3 and the treating liquid discharge through the drain/supply pipe 4.

The flow control valve 21 may be mounted on the piping between the output port OP of integrated mixing valve 9 and the three-way valve 6. In this case, the liquid level is adjusted by controlling a treating liquid supply through the overflow passage 3 to the treating bath 1.

Where, as in the prior art, a treating liquid is supplied to the treating bath 1 through the drain/supply pipe 4 and discharged from the treating bath 1 through the overflow passage 3 to the drain 7, a balance between supply and discharge of the treating liquid may be secured by using a conventional technique. In this case also, wafer treatment may be carried out with greater safety by detecting a liquid level as described above and adjusting flow rates of supply and discharge to maintain a standard liquid level.

The liquid level will never be lower than the standard level in this treating liquid overflow mode. However, when the treating liquid is supplied in a smaller quantity than it is discharged, the treating liquid in the treating bath 1 would spill out of the overflow passage 3. In this case, as described hereinbefore, the level controller 25 may be operated to adjust the supply of deionized water (treating liquid) from the deionized water source 19 or to adjust a discharge of deionized water to the drain 7.

A controller 26 shown in FIG. 1 receives results of detection from the resistivity meter 8 and chemical concentration monitor 20, and controls operation of the three-way valve 6, the switch valves 10a–10d and 12 in the integrated mixing valve 9, the switch valves 16 and 17 in the integrated switch valve 15, and the switch valve 22, and opening and closing of the auto covers 2a and 2b of open chamber 2. This control operation is carried out in a sequence described hereinafter. The controller 26 corresponds to the control device of the present invention, which could be, for example, a microcomputer.

The overflow passage 3, pipe 5, three-way valve 6, drain 7, integrated mixing valve 9, chemical sources 11a-11d and deionized water source 13 constitute the upper treating liquid discharge device and upper treating liquid supply device of the present invention. The drain/supply pipe 4, pipe 14, integrated switch valve 15, drain 18, deionized water source 19, switch valve 22 and flow control valve 23 constitute the lower treating liquid discharge device and lower treating liquid supply device of the present invention. The three-way valve 6 corresponds to the first switching device of the present invention. The integrated switch valve 15 corresponds to the second switching device of the present invention. The level sensor 24 corresponds to the level detecting device of the present invention. The level controller 25, flow control valve 21 and motor 21a constitute the flow control device of the present invention. The resistivity meter 8 corresponds to the resistivity measuring device of the present invention. In this embodiment, various chemicals and deionized water are included as the treating liquids according to the present invention.

Next, a sequence of wafer treatment in this embodiment will be described with reference to the flowchart shown in FIG. 3. The following description exemplifies a case of treating a wafer with a plurality of different chemicals according to a recipe, and treating (cleaning) the wafer with deionized water after treatment with each chemical. For example, the wafer is treated with liquids supplied in the order of a first chemical, deionized water (which is one of the treating liquids), a second chemical (different from the first chemical), deionized water, a third chemical (different from the first and second chemicals), deionized water, and so on. One cycle of treatment with a chemical and deionized water is carried out at steps S3–S7 in the flowchart. These steps S3–S7 are repeated until completion of the treatment with all the chemicals based on the recipe (step S8). The order of chemicals used in the treatment is determined by the recipe.

An initial process is carried out prior to commencement of the treatment (step S1). In the initial process, deionized water is caused to overflow at a minimum flow rate required. Specifically, the switch valve 16 is closed, the switch valve 17 opened and the switch valve 22 closed. The flow control valve 23 is operated to reduce deionized water flowing from the deionized water source 19 to the required minimum flow rate. The deionized water is supplied at this rate through the pipe 14 and drain/supply pipe 4 to the bottom of the treating bath 1. On the other hand, the three-way valve 6 is operated to place the common port CP and port P1 in communication. Consequently, the deionized water supplied to the bottom of the treating bath 1 and spilling into the overflow passage 3 flows to the drain 7.

A wafer W is introduced while the deionized water is overflowing at the required minimum flow rate. That is, the auto covers 2a and 2b of the open chamber 2 are opened. The wafer W is transported into the treating bath 1 and placed on the holder therein. Then, the auto covers 2a and 2b are closed (step S2).

Next, the deionized water in the treating bath 1 is replaced with a chemical to be used in the current cycle of treatment (step S3). In this example, the first treating liquid is deionized water, and the second treating liquid is the chemical replacing the deionized water.

Specifically, the switch valve 16 is opened and the switch valve 17 is closed to draw the deionized water (first treating liquid) from the bottom of the treating bath 1 to the drain 18. In parallel thereto, the three-way valve 6 is switched from the drain 7 to the integrated mixing valve 9. One of the switch valves 10a–10d connected to the chemical source 112a, 11b, 11c or 11d which supplies the chemical to be used is opened, and the switch valve 12 connected to the deionized water source 13 is also opened. Thus, the chemical (second treating liquid) is diluted with deionized water to a predetermined concentration, and supplied to the top of the treating bath 1. At this time, the level sensor 24 detects a liquid level. Based on the detection data, the level controller 25 adjusts a rate of flow through the flow control valve 21 to maintain the standard liquid level. In this way, the deionized water is replaced with the chemical while maintaining a balance between the discharge of the deionized water and supply of the chemical. Completion of the replacement is determined based on whether the concentration of the chemical in the liquid discharged, which is detected by the chemical concentration monitor 20, has reached the predetermined concentration.

Thus, the deionized water drawn off from the bottom of the treating bath 1 is replaced with the chemical supplied to the top of the treating bath 1 (this replacement being hereinafter referred to also as "replacement in the downflow mode"). The replacement of the deionized water with the chemical is carried out smoothly by utilizing the gravitational downflow of the treating liquids (deionized water and chemical) within the treating bath 1. It has been found through experiment that the quantity of the chemical used (or supplied) for the replacement ranges approximately from the same as the capacity of the treating bath 1 to twice the capacity. In the conventional treating liquid replacing method, the quantity of a chemical used (or supplied) for replacement is 3 to 10 times the capacity of the treating bath. By contrast, in the treating liquid replacing method according to the present invention, the second treating liquid (a chemical here but deionized water at subsequent step S5) is required in a far smaller quantity, results in a reduction in operating cost.

After completing the replacement of deionized water with the chemical, the wafer W is treated with this chemical as necessary (step S4). At step S3 also, the wafer W receives treatment with the chemical in downflow state during the replacing process. Depending on the type of chemical, it may be desirable to maintain the wafer W immersed in the chemical stored in the treating bath 1 for a predetermined time. In this case, the switch valves 10a–12d and 12 in the integrated mixing valve 9 and the switch valves 16 and 17 are all closed to stop the chemical supply to the treating bath 1 and the chemical discharge from the treating bath 1 to the drain 18.

The condition at step S3 may be maintained for a predetermined time after completion of the replacement of the deionized water with the chemical. Consequently, the wafer W is treated with the chemical continuously supplied to the top of the treating bath 1 while being discharged from the bottom thereof (this wafer treatment being hereinafter referred to also as "wafer treatment in the downflow mode"). This treatment produces an enhanced result since the chemical contaminated through the treatment is discharged from the bottom of the treating bath 1.

Next, the chemical is replaced with deionized water in the downflow mode as at step S3 (step S5). Specifically, the switch valve 16 is opened and the switch valve 17 closed to discharge the chemical (first treating liquid in this case) from the bottom of the treating bath 1 to the drain 18. In parallel thereto, the threeway valve 6 is switched from the drain 7 to the integrated mixing valve 9. Only the switch valve 12 is opened to supply deionized water to the top of the treating bath 1. At this time also, the level sensor 24, level controller 25 and flow control valve 21 effect the controls to maintain the standard liquid level. Completion of the replacement is determined based on whether the concentration of the chemical in the liquid discharged, which is detected by the chemical concentration monitor 20, has reached a predetermined value.

In this way, the chemical is replaced with the deionized water in the downflow mode, whereby the chemical is washed off the wafer W by the deionized water. Particles and the like removed from the wafer W by the chemical are discharged along with the chemical from the bottom of the treating bath 1 to the drain 18.

Next, the three-way valve 6 is switched to the drain 7. The switch valve 16 is closed and the switch valves 17 and 22 are opened to supply deionized water to the bottom of the treating bath 1. The deionized water spilling to the overflow passage 3 is discharged to the drain 7. Thus, the wafer W is treated (cleaned) with the deionized water in the overflowing state (step S6).

The resistivity meter 8 measures the resistivity of the deionized water flowing to the drain 7. The treatment with the deionized water in the overflowing state is continued until the resistivity of the deionized water recovers to a predetermined threshold level or above (step S7). The resistivity of the deionized water is low, indicating that the treatment is insufficient, if the chemical has not sufficiently been washed off the wafer W by the deionized water during the treatment in the downflow mode at step S5 or when particles washed off the wafer W are present. By continuing wafer treatment with the deionized water in the downflow mode until recovery of the resistivity of the deionized water, the wafer treatment may be terminated only upon confirmation of sufficient treatment being provided, thereby assuring increased precision of wafer treatment.

In this embodiment, the wafer treatment is performed inside the open chamber 2. Therefore, when the wafer W is treated with deionized water in the downflow mode at step S5, oxygen in the atmosphere tends to be dissolved in the deionized water flowing from the overflow passage 3 into the treating bath 1. It is desirable that the deionized water used in wafer treatment has a low concentration of oxygen. A high concentration of oxygen in deionized water would lower the resistivity of the deionized water and diminish the effect of treatment. In this embodiment, therefore, the wafer treatment with deionized water in the downflow mode at step S5 is followed by the wafer treatment with deionized water in the overflowing state at step S6. In wafer treatment in the overflowing state, surface portions of the deionized water contacting the atmosphere are discharged from the overflow passage 3. This process restrains oxygen from dissolving in the deionized water inside the treating bath 1.

Upon recovery of the resistivity of deionized water, one cycle of wafer treatment with the chemical and deionized water is completed. It is then determined whether this wafer W should be treated with a next chemical and deionized water (step S8). If further treatment is required, the operation returns to step S3. If not, the operation proceeds to step S9.

At step S9, the treated wafer W is transported out of the apparatus. That is, the auto covers 2a and 2b of the open chamber 2 are opened. The wafer W is raised from the treating liquid (deionized water) in the treating bath 1, and transported out of the open chamber 2. Then, the auto covers 2a and 2b are closed. At this time, the overflowing state of deionized water as at step S6 is maintained. The wafer W is raised from the treating bath 1 while particles floating on the liquid surface and the deionized water in which oxygen has been dissolved are discharged through the overflow passage 3. Thus, particles and the like on or adjacent the liquid surface are restrained from adhering to the wafer W.

Subsequently, whether to terminate the wafer treatment (no wafer remaining to be treated) or not is determined at step S10. If the treatment should be continued, the operation proceeds to step S11.

Step S11 is executed to prepare for treatment of the next wafer W. In this preparation process, deionized water is caused to overflow at the required minimum rate as in the initial process at step S1. Currently, the apparatus is in the state of deionized water overflowing the treating bath 1. All that is required at this stage is to close the switch valve 22, causing the deionized water to be supplied through the flow control valve 23 at the minimum flow rate.

In the above sequence, each chemical used in wafer treatment is replaced with deionized water in the downflow mode (step S5), and then wafer treatment is carried out with deionized water in the overflowing state (step S6). Recovery of the resistivity of deionized water is monitored for each wafer treatment with deionized water in overflowing state. However, wafer treatment may be terminated upon confirmation of results of the treatment by monitoring recovery of the resistivity only when the wafer W is treated with deionized water in overflowing state after a final chemical used in the treatment is replaced with the deionized water in the downflow mode. That is, recovery of the resistivity may be monitored only during a final treatment of wafer W with deionized water in the overflowing state.

Alternatively, the wafer treatment with deionized water in the overflowing state may be timer-controlled, so that this treatment is performed for a predetermined time (to assure sufficient treatment). In this case, the resistivity of deionized water is not monitored, and hence the resistivity meter 8 may be omitted.

Where the chemicals used include HF, silicon surfaces of the wafer W deposited by HF react with oxygen through contact with deionized water in which oxygen is dissolved. This reaction forms silicon dioxide ($SO_2$) which results in particles. It is therefore undesirable to supply deionized water in the downflow mode at step S5, in which oxygen tends to dissolve. Thus, where HF is used as a chemical, step S6 may be executed after step S4, bypassing step S5.

The overflow passage 3, drain/supply pipe 4, pipes 5 and 14, chemical sources 11a–11d and deionized water sources 13 and 14 may be adjusted to secure a balance between treating liquid supply through the overflow passage 3 and treating liquid discharge through the drain/supply pipe 4, and between treating liquid discharge through the overflow passage 3 and treating liquid supply through the drain/supply pipe 4. Then, it is unnecessary to control liquid level by means of the level sensor 24, level controller 25 and flow control valve 21. These three components may be omitted from the apparatus.

In the first embodiment and the other embodiments described hereinafter, the treating liquid supply and discharge through the top of the treating bath 1 are switched by operating the threeway valve 6 to use the overflow passage 3 in both cases. A pipe for supplying the treating liquids to the top of the treating bath 1 may be provided alongside the overflow passage 3. Similarly, a separate supply pipe and drain pipe may be provided to, supply and drain the treating liquids to or from the bottom of the treating bath 1.

Figure 4:
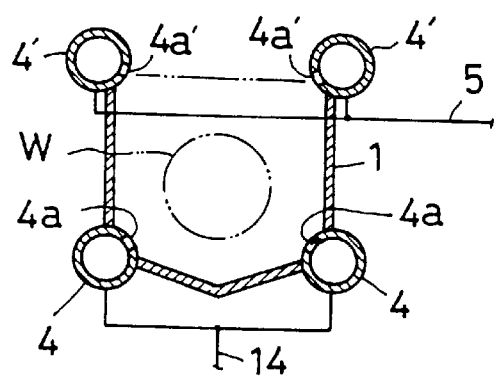
FIG. 4 is a view in vertical cross-section of a modified treating bath.

As shown in FIG. 4, a drain/supply pipe 4' similar to the drain/supply pipe 4, may be provided in upper positions of the treating bath 1 in order to provide a uniform treating liquid supply and discharge through the top and treating liquid supply and discharge through the bottom of the treating bath 1. Bores 4a' shown in FIG. 4 are those bores formed in the drain/supply pipe 4' (for supplying and discharging the treating liquids) which correspond to the bores 4a in the drain/supply pipe 4.

Second Embodiment

Figure 5:
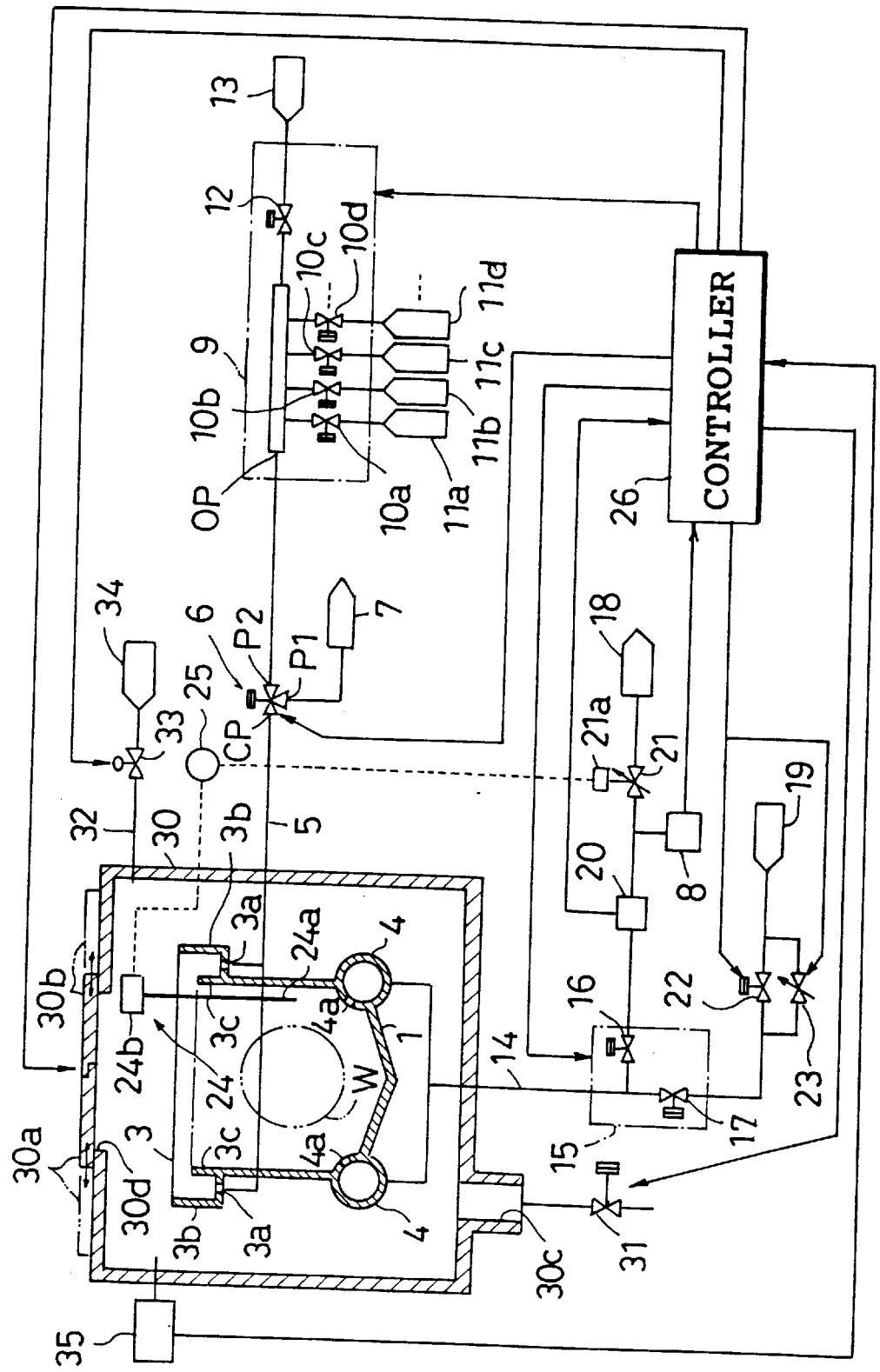
FIG. 5 is a schematic overall view of a second embodiment of the substrate treating apparatus of the invention.

An apparatus in the second embodiment will be described with reference to FIG. 5.

In the second embodiment, the treating bath 1 is mounted in a closed chamber 30 filled with an inert gas (e.g. nitrogen gas). Replacement of the treating liquids and wafer treatment are conducted in an inert gas atmosphere. The second embodiment is the same as the first embodiment in the other respects. Like reference numerals are used to identify like parts in FIG. 1 and will not be described again.

The closed chamber 30 includes a pair of auto covers 30a and 30b slidable between positions shown in solid lines and phantom lines to enhance a sealed condition of the chamber 30. An exhaust pipe 30c has a switch valve 31 for switching between an exhaust state and a sealed state. Reference 30d in FIG. 5 denotes an opening for passage of a wafer W.

A pipe 32 extends into the closed chamber 30 for supplying the inert gas. The pipe 32 has a switch valve 33 operable to supply the inert gas or to stop the inert gas supply from an inert gas source 34 to the closed chamber 30.

The closed chamber 30 further includes an oxygen concentration monitor 35 for measuring oxygen concentration in the chamber 30.

In the second embodiment, the resistivity meter 8 is mounted on the drain line extending from the bottom of the treating bath 1 for detecting resistivity of deionized water discharged from the bottom of the treating bath 1.

The switch valves 31 and 33, pipe 32 and inert gas source 34 constitute the inert gas supplying device of the present invention. The oxygen concentration monitor 35 corresponds to the oxygen concentration measuring device of the present invention.

Next, a sequence of wafer treatment in the second embodiment will be described with reference to the flowcharts shown in FIGS. 6 and 7. As in the first embodiment, the wafer is treated, based on a recipe, with a plurality of different chemicals, and with deionized water after treatment with each chemical.

First, at steps S21 and S22, an initial process is carried out and a wafer is introduced as in the first embodiment (steps S1 and S2 in FIG. 3).

Next, the closed chamber 30 is filled with the inert gas (i.e. purged with the inert gas) (steps S23). This operation is carried out by opening the switch valves 31 and 33 to exhaust air from the chamber 30 and supply the inert gas thereto.

After the chamber 30 is purged with the inert gas, wafer treatment is performed using the different chemicals according to the recipe (step S24). This process follows the flowchart shown in FIG. 7.

Figure 7:
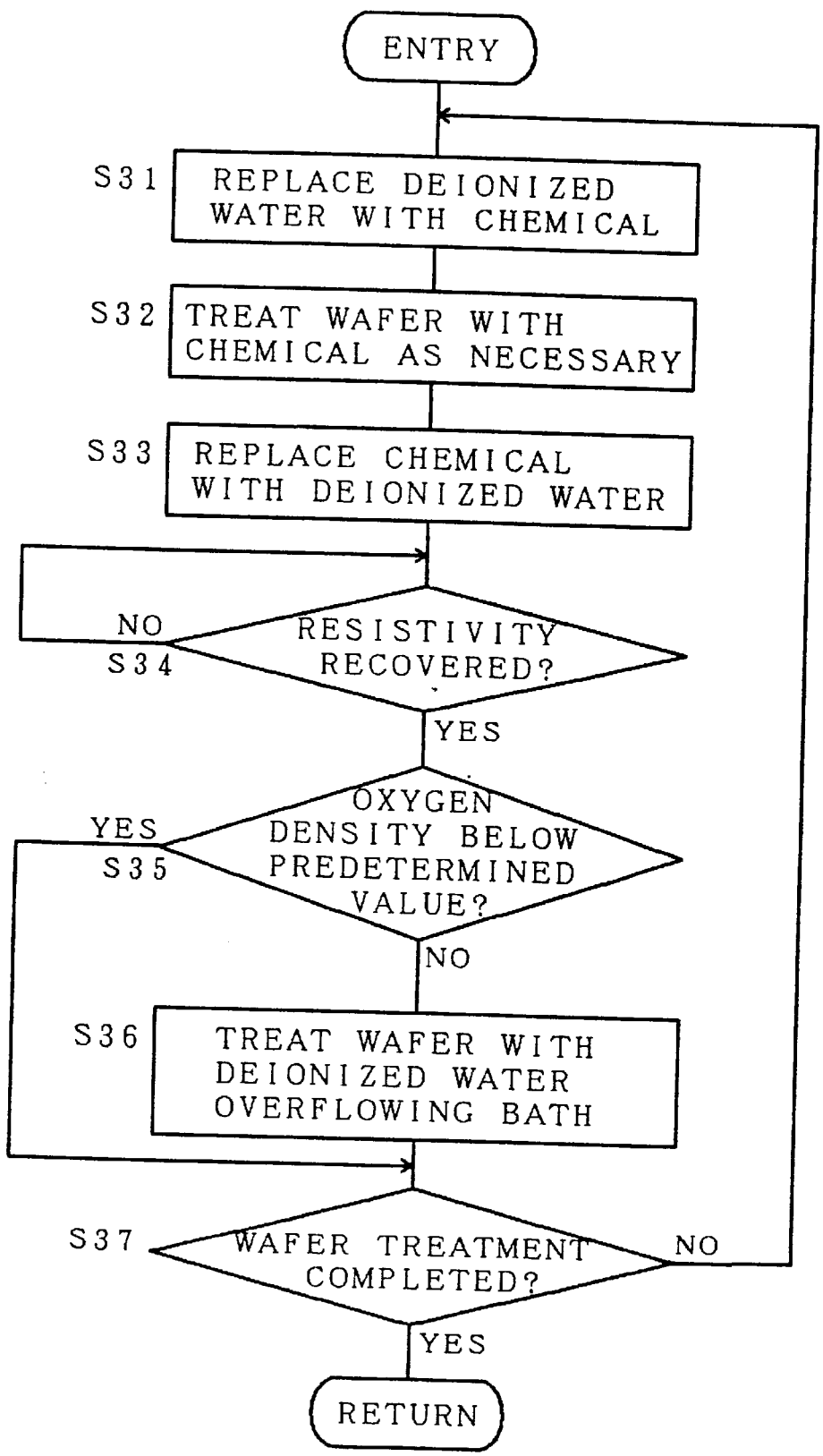
FIG. 7 is a flowchart showing a sequence of treatment for a substrate introduced into a treating bath in the second embodiment.

Referring to FIG. 7, steps S31–S33 are the same as in the first embodiment (steps S3–S5 in FIG. 3) and will not be described.

In this embodiment, after the chemical is replaced with deionized water in the downflow mode (step S33), the downflow (wafer treatment with deionized water in the downflow mode) is maintained until the resistivity of discharged deionized water recovers (step S34) without treating the wafer with deionized water in the overflowing state as in the first embodiment (step S6 in FIG. 3). That is, in this embodiment, as distinct from the first embodiment, the wafer treatment is performed in an inert gas atmosphere, and the oxygen concentration in the chamber 30 under normal conditions is lower than a predetermined level (at which oxygen dissolves in deionized water with ease). In this embodiment, therefore, oxygen does not dissolve in deionized water. It is unnecessary to treat the wafer with deionized water in the overflowing state after treatment with deionized water in the downflow mode as in the first embodiment.

If the resistivity is found not to recover for a predetermined time at step S34, an abnormality may be notified to the operator by lighting a lamp and/or by sounding a buzzer to discontinue the wafer treatment.

Next, when the oxygen concentration monitor 35 measuring an oxygen concentration in the chamber 30 indicates the concentration to be at or above a predetermined level (e.g. when the inert gas atmosphere is impaired), the wafer is treated with deionized water in the overflowing state (steps S35 and S36). The wafer treatment with deionized water in the overflowing state may be timer-controlled to be terminated upon lapse of a predetermined time. Alternatively, a resistivity meter 8 may be mounted on the drain line extending from the top of the treating bath 1, and the wafer treatment with deionized water in the overflowing state is continued until recovery of the resistivity of the overflowing deionized water. As in the first embodiment, this eliminates the inconvenience caused by dissolution of oxygen in the deionized water.

Then, it is determined whether the treatment with all the chemicals based on the recipe has been completed (step S37). If the treatment has not been completed, the operation returns to step S31 to perform wafer treatment with a next chemical and deionized water.

Figure 6:
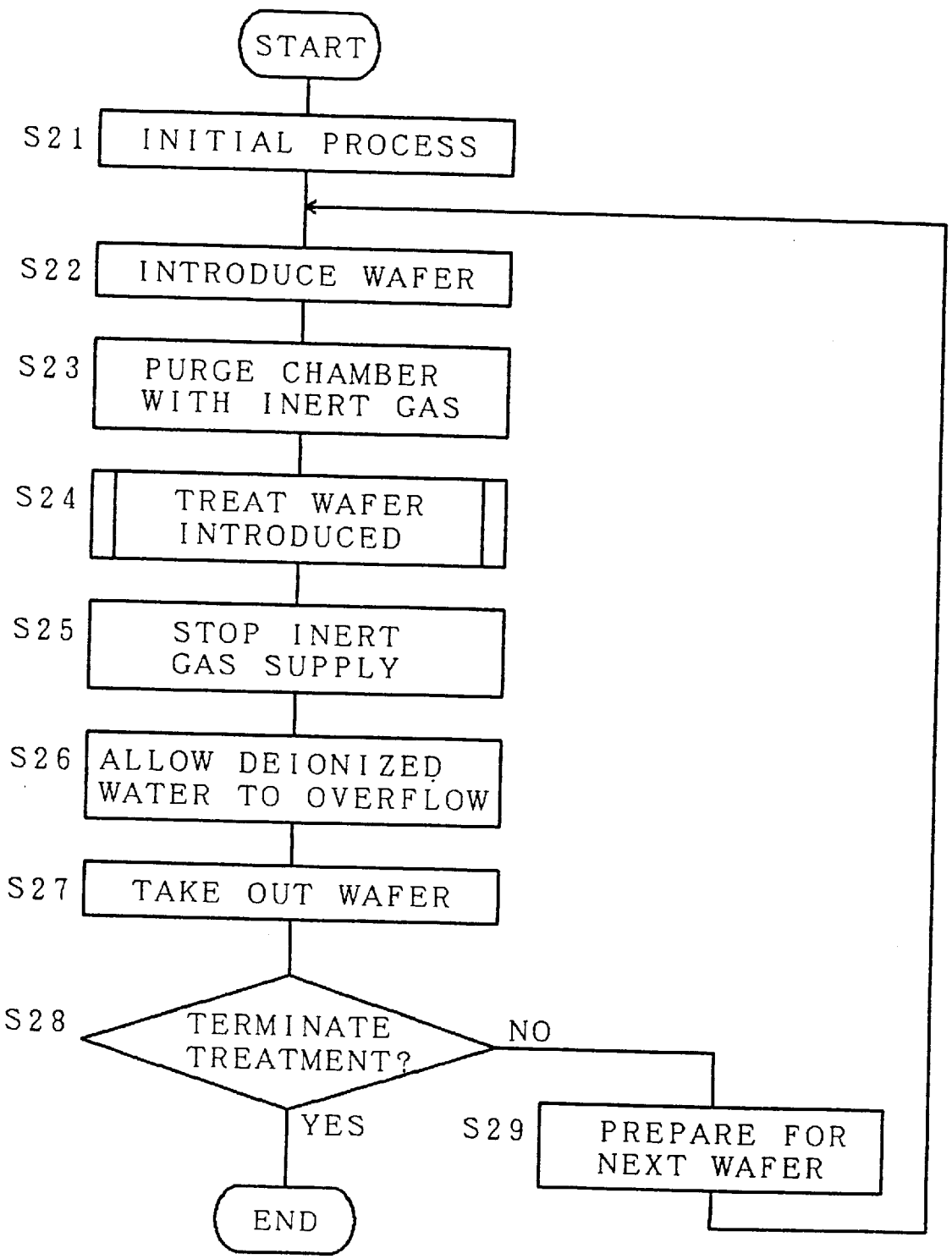
FIG. 6 is a main flowchart showing a sequence of substrate treatment in the second embodiment.

Reverting to FIG. 6, when the treatment of wafer W at step S24 is completed, the switch valve 33 is closed to stop the inert gas supply (step S25). Prior to raising the treated wafer W from the treating bath 1, deionized water is supplied to the bottom of the treating bath 1 to overflow the top thereof to be discharged into the drain 7 (step S26). The treated wafer W is raised from the treating bath 1 while the deionized water is overflowing. The auto covers 30*a* and 30*b* are opened, the wafer W is transported out of the chamber 30, and the auto covers 30*a* and 30*b* are closed (step S27). By raising the wafer W from the treating bath 1 while the deionized water is overflowing as described above, any particles and the like floating on the liquid surface are prevented from adhering to the wafer W.

Subsequently, at step S28, whether to terminate the wafer treatment or not is determined as in the first embodiment (steps S10 and S11 in FIG. 3). If there remains a wafer to be treated, switching is made to cause deionized water to overflow at the minimum required rate (step S29).

Figure 8:
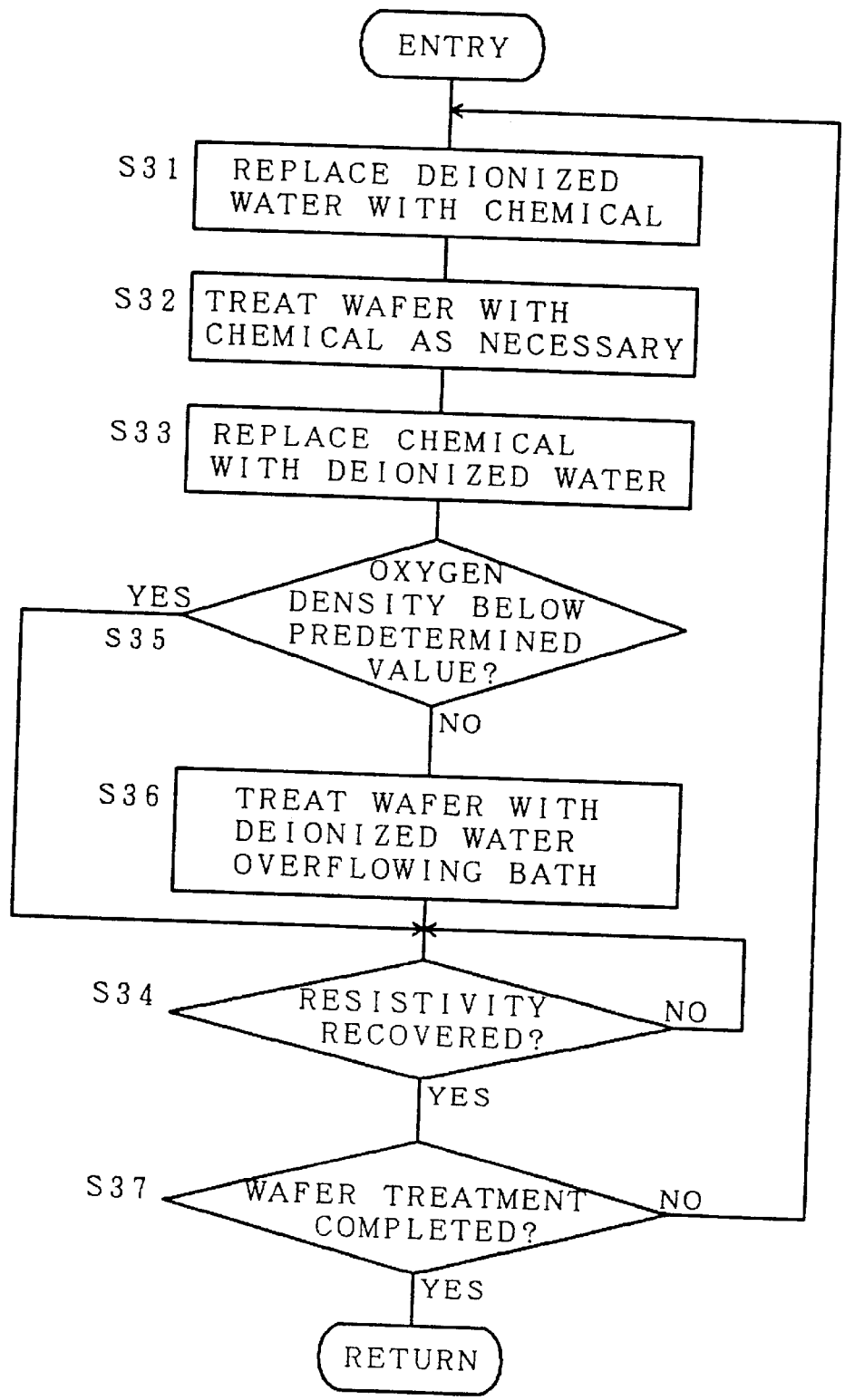
FIG. 8 is a flowchart showing a different sequence of treatment for a substrate introduced into the treating bath in the second embodiment.

The wafer W introduced into the treating bath 1 may be treated in the sequence shown in FIG. 8 instead of that shown in FIG. 7. The sequence of FIG. 8 differs from that of FIG. 7 in that step 34 and steps S35 and S36 are swapped. In this sequence, the oxygen concentration in the chamber 30 is measured while deionized water is in the downflow state at step S33. If the oxygen concentration measured is below the predetermined level, the resistivity of the deionized water discharged in the downflow state from the bottom of the treating bath 1 is measured. This downflow state of deionized water is maintained until recovery of the resistivity. If the oxygen concentration measured is at or above the predetermined level, switching is made to the overflowing state of the deionized water. The resistivity of the deionized water discharged from the top of the treating bath 1 is measured. The overflowing state of the deionized water is maintained until recovery of the resistivity. For effecting wafer treatment in this sequence, a resistivity meter 8 may be provided in the same location as in the first embodiment to measure the resistivity of the deionized water discharged from the top of the treating bath 1 to the drain 7.

The overflowing of deionized water at the required minimum rate at steps S21 and S29 in FIG. 6 may be changed to "downflow" of deionized water at the required minimum rate.

At step S26 in FIG. 6, deionized water is caused to overflow the treating bath 1 to be on the safe side, i.e. to restrain any particles and the like on the liquid surface from adhering to the wafer W raised from the treating liquid (deionized water) in the treating bath 1. In this embodiment, the wafer treatment is conducted in the inert gas atmosphere inside the closed chamber 30, and particles and the like washed off the wafer W are likely to be removed during the wafer treatment. There is very little chance there being of particles and the like floating on the surface of the treating liquid (deionized water) in the treating bath 1 at the end of the treatment. Thus, the overflowing of deionized water at step S26 in FIG. 6 may be omitted.

Figure 9:
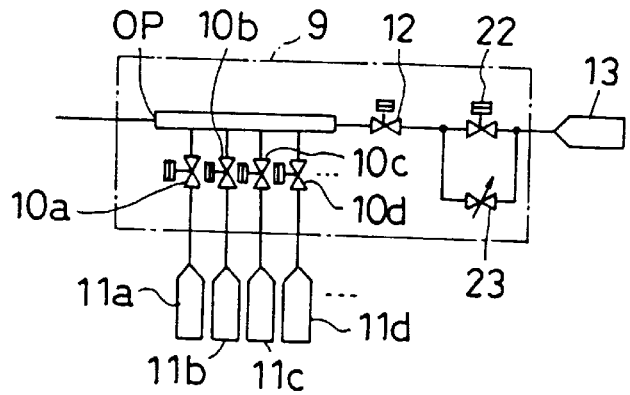
FIG. 9 is a schematic view showing a principal portion of a modification of the second embodiment (i.e. an integrated mixing valve)

In the sequences shown in FIGS. 7 and 8, the oxygen concentration in the chamber 30 is measured and, if the concentration is at or above the predetermined level, deionized water is caused to overflow. An increase in the oxygen concentration in the chamber 30 to or above the predetermined level is considered, in most cases, because of a problem in the closed chamber 30 or the inert gas supply line including the inert gas source 34. Thus, instead of taking a makeshift measure of causing deionized water to overflow, an operator should be notified of a malfunctioning apparatus by lighting a lamp and/or sounding a buzzer to discontinue wafer treatment.

Where the deionized water overflowing at steps S21, S26, S29 and S36 in FIGS. 6 through 8 is canceled altogether, it is possible to eliminate the deionized water supply line extending to the bottom of the treating bath 1 (i.e. the deionized water source 19, switch valves 17 and 22, and flow control valve 23) and the deionized water drain line extending from the top of the treating bath 1 (i.e. the three-way valve 6 and drain 7). In this case, in order to realize "downflow" of deionized water at the required minimum rate at steps S21 and S29 in FIG. 6, the integrated mixing valve 9 may be modified as shown in FIG. 9, to include the switch valve 22 and flow control valve 21 arranged in parallel between the switch valve 12 and deionized water source 13.

Recovery of the deionized water resistivity of may be checked during the final phase of treatment using deionized water as in the first embodiment (the deionized water being in downflow state or overflowing state), or this checking may be omitted.

Third Embodiment

Figure 10:
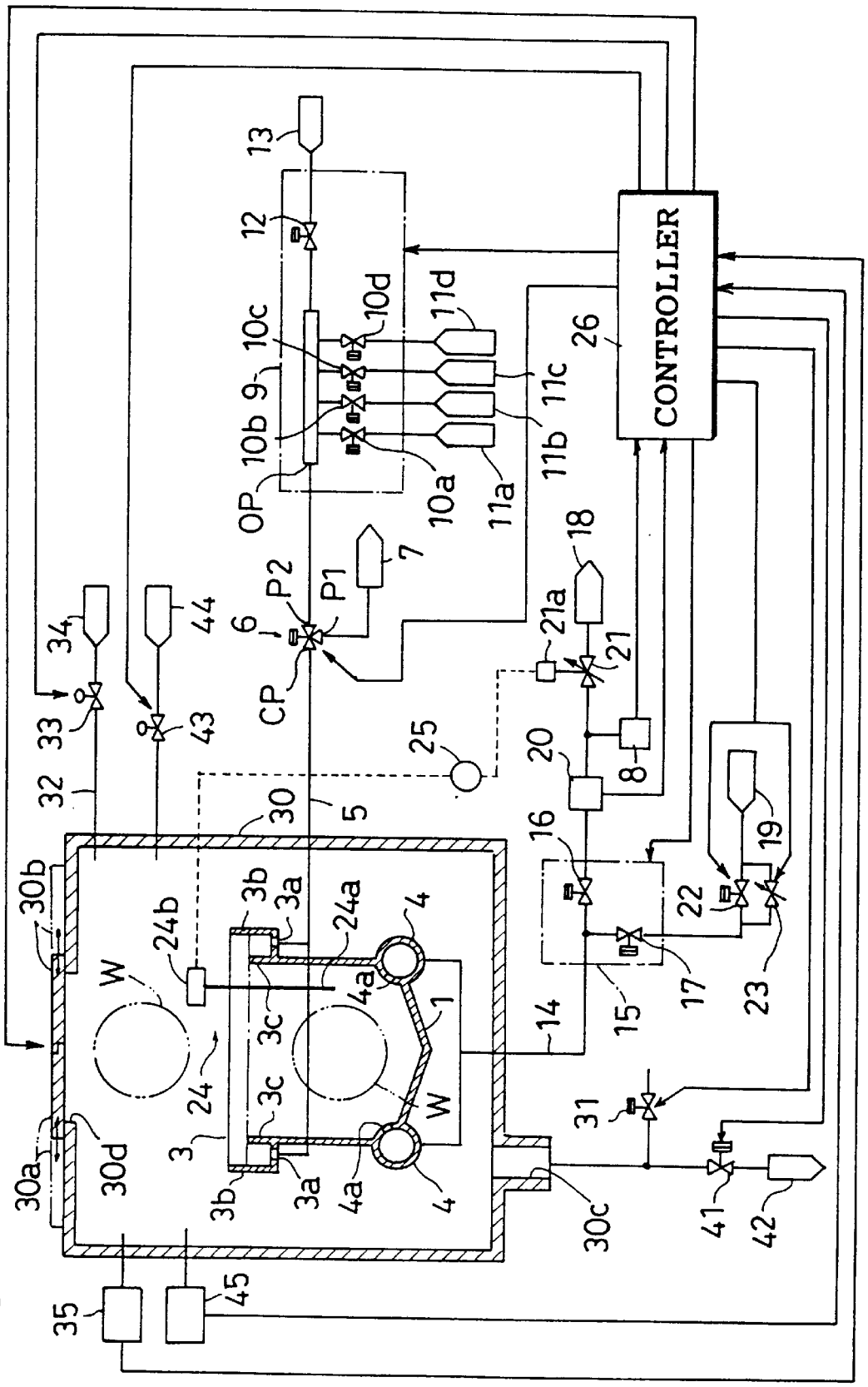
FIG. 10 is a schematic overall view of a third embodiment of the substrate treating apparatus of the invention.

An apparatus in the third embodiment will be described with reference to FIG. 10.

The third embodiment differs from the second embodiment in that treated wafer W is dried in the chamber 30. The third embodiment is the same as the second embodiment in the other respects. Like reference numerals are used to identify like parts in FIG. 5 and will not be described again.

The closed chamber 30 in-this embodiment defines a space between the auto covers 30a and 30b and treating bath 1 for stopping and drying treated wafer W. The exhaust pipe 30c is connected also to a vacuum source 42 through a switch valve 41. This embodiment further includes an IPA (isopropyl alcohol) supply line having a switch valve 43 operable to supply IPA from an IPA source 44 to the closed chamber 30. An atmospheric pressure monitor 45 is also provided to measure atmospheric pressure inside the closed chamber 30.

Figure 11:
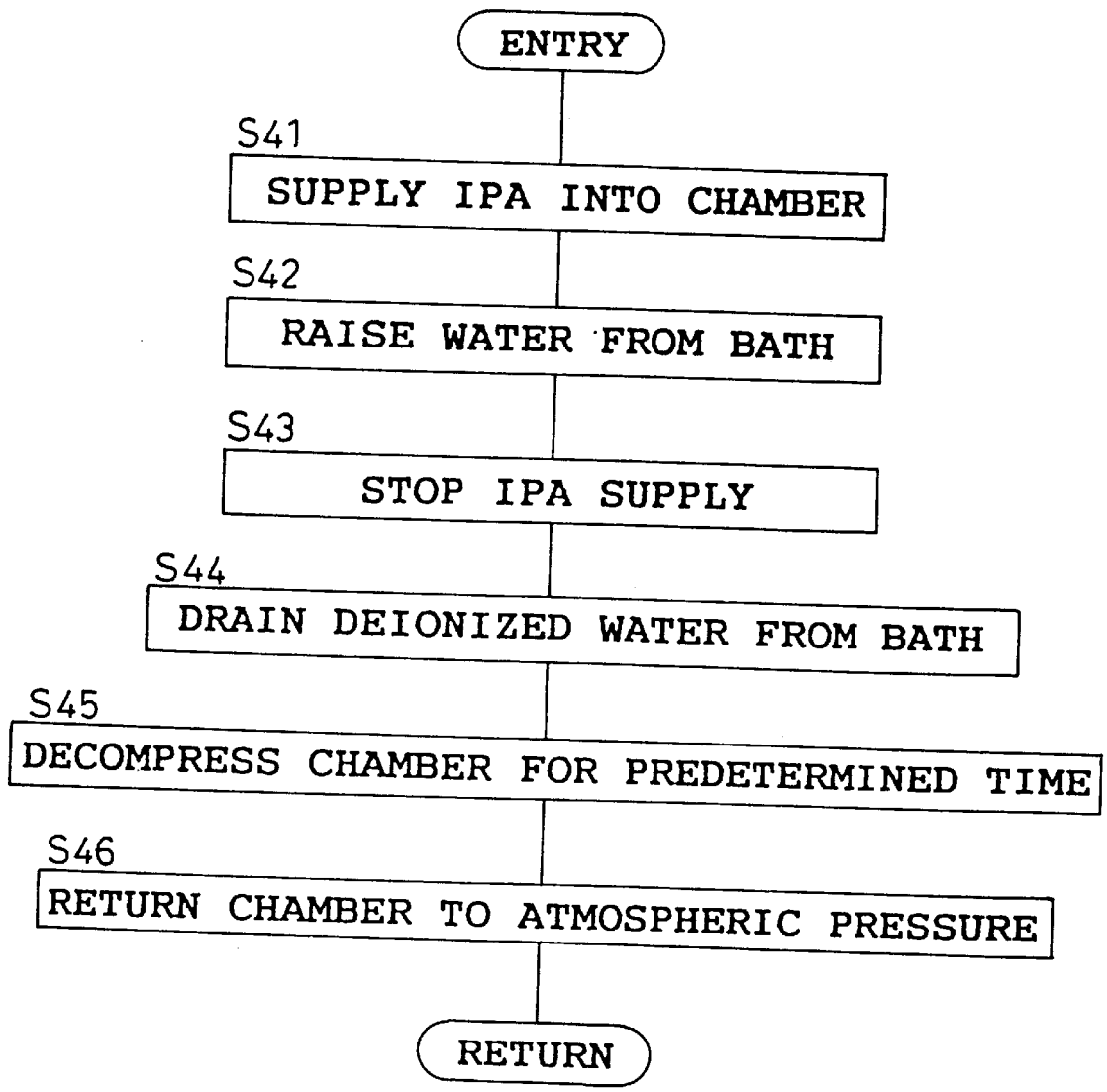
FIG. 11 is a flowchart showing a sequence steps for drying a treated substrate in the third embodiment.

The wafer treatment in this embodiment is performed in the same sequence as in the second embodiment (FIGS. 6 and 7 or 8). In this embodiment, however, an additional, drying treatment is given to the cleaned wafer W before leaving the closed chamber 30. The drying treatment is performed in the sequence shown in FIG. 11, between steps S26 and S27 in the flowchart of FIG. 6. The drying treatment will be described hereinafter with reference to the flowchart of FIG. 11.

First, the switch valve 43 is opened to supply IPA into the closed chamber 30 (step S41). Next, the wafer W is raised from the deionized water in the treating bath 1 while the deionized water is in overflowing state (at step S26 in FIG. 6), and the wafer W is stopped in a position to be dried (step S42). Then, the switch valve 43 is closed to stop the IPA supply (step S43).

Next, the deionized water supply to the treating bath 1 is stopped, and the deionized water is drained from the bottom of the treating bath 1 (step S44). When the treating bath 1 becomes empty of the deionized water, the switch valve 31 is closed and the switch valve 41 opened to decompress the closed chamber 30 (step S45). After a predetermined time of decompression, the switch valve 33 is opened and the switch valve 41 closed, with the switch valve 31 remaining closed, to restore atmospheric pressure in the closed chamber 30 (step S46). The restoration of atmospheric pressure in the chamber 30 is determined by the atmospheric pressure monitor 45. Once atmospheric pressure is restored in the chamber 30, the auto covers 30a and 30b are opened, the cleaned and dried wafer W is transported out of the chamber 30, and the auto covers 30a and 30b are closed (step S27 in FIG. 6).

As a result of the drying treatment, water adhering to the cleaned wafer W is replaced by IPA, and drying action is promoted by decompression. This effectively avoids the inconvenience of forming water marks on the surface of wafer W. The deionized water is drained from the treating bath 1 (at step S44) prior to the decompression process (at step S45) in order to avoid a situation in which the deionized water in the treating bath 1 evaporates during the decompression to affect the drying treatment of the wafer W.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus having a treating bath for treating a substrate, said apparatus comprising:

upper treating liquid supply means for supplying a treating liquid to an upper position of said treating bath;

upper treating liquid discharge means for discharging a treating liquid from said upper position of said treating bath;

lower treating liquid supply means for supplying a treating liquid to a lower position of said treating bath;

lower treating liquid discharge means for discharging a treating liquid from said lower position of said treating bath; and treating liquid replacing means for discharging a first treating liquid in said treating bath from said lower position of said treating bath by said lower treating liquid discharge means while supplying a second treating liquid to said upper position of said treating bath by said upper treating liquid supply means, said first treating liquid being discharged and said second treating liquid being supplied by maintaining a balance between a quantity of said first treating liquid discharged and a quantity of said second treating liquid supplied, thereby replacing said first treating liquid with said second treating liquid.

2. A substrate treating apparatus as defined in claim 1, wherein said upper treating liquid discharge means and said upper treating liquid supply means comprise:

an overflow passage disposed adjacent said upper position of said treating bath for allowing said treating liquid to flow into and out of said treating bath; and first switching means for switching between discharge of said treating liquid from said treating bath to said overflow passage, and inflow of said treating liquid from said overflow passage to said treating bath; and wherein said lower treating liquid discharge means and said lower treating liquid supply means comprise:

a drain/supply pipe disposed adjacent said lower position of said treating bath; and second switching means for switching between discharge of said treating liquid from said treating bath to said drain/supply pipe, and inflow of said treating liquid from said drain/supply pipe to said treating bath.

3. A substrate treating apparatus as defined in claim 1, wherein said treating liquid replacing means comprises:

level detecting means for detecting a level of said treating liquid in said treating bath; and flow control means for controlling, based on said level detected, at least one of a quantity of said treating liquid discharged from said treating bath and a quantity of said treating liquid supplied to said treating bath to maintain a predetermined level.

4. A substrate treating apparatus as defined in claim 1 further comprising:

a closed chamber for accommodating said treating bath; and inert gas supplying means for filling said closed chamber with an inert gas;

said first treating liquid being replaced and substrate treatment being carried out in said closed chamber filled with said inert gas.

5. A substrate treating apparatus as defined in claim 4, further comprising:

oxygen concentration measuring means for measuring oxygen concentration in said closed chamber; and control means for discharging a chemical acting as a first treating liquid from said lower position of said treating bath, and supplying deionized water acting as a second treating liquid to said upper position of said treating bath, to replace said chemical with said deionized water, if said oxygen concentration measured is at or above a predetermined threshold level at which oxygen is readily dissolved in said deionized water, said deionized water thereafter being supplied to said lower position of said treating bath, an overflow of said deionized water being discharged from said upper position of said treating bath, to treat said substrate with said deionized water in an overflowing state.

6. A substrate treating apparatus as defined in claim 1, further comprising:

a decompressible closed chamber for accommodating said treating bath and defining a space above said treating bath for drying said substrate with an organic solvent vapor;

organic solvent vapor supplying means for filling said closed chamber with said organic solvent vapor; and control means for raising said substrate while supplying said organic solvent vapor, after said substrate is treated with said treating liquid, and subsequently stopping supply of said organic solvent vapor and decompressing said closed chamber to effect drying treatment for said substrate.

7. A substrate treating apparatus as defined in claim 1, further comprising control means operable, when said second treating liquid comprises a chemical, for causing said second treating liquid to be supplied to said upper position of said treating bath and discharged from said lower position of said treating bath, after said first treating liquid is replaced with said second treating liquid, to treat said substrate with said second treating liquid in a downflow state for a predetermined time.

8. A substrate treating apparatus as defined in claim 1, further comprising control means operable, when said second treating liquid comprises a chemical, for stopping supply and discharge of said second treating liquid for a predetermined time, after said first treating liquid is replaced with said second treating liquid, to treat said substrate with said second treating liquid as immersed in said second treating liquid.

9. A substrate treating apparatus as defined in claim 1, further comprising control means operable, when said second treating liquid comprises deionized water, for causing said second treating liquid to be supplied to said lower position of said treating bath, an overflow of said second treating liquid being discharged from said upper position of said treating bath, after said first treating liquid is replaced with said second treating liquid, to treat said substrate with said second treating liquid in an overflowing state.

10. A substrate treating apparatus as defined in claim 1, further comprising control means operable, after completing the treatment of said substrate with said first treating liquid and said second treating liquid stored in said treating bath, for causing deionized water to be supplied to said lower position of said treating bath, an overflow of said deionized water being discharged from said upper position of said treating bath so that said deionized water is in an overflowing state, said substrate being raised from said treating bath while said deionized water is in said overflowing state.

11. A substrate treating apparatus as defined in claim 10, wherein said control means is operable for causing said substrate to be treated with a plurality of different chemicals based on a recipe, said substrate being treated with deionized water after treatment with each of said chemicals, and said treating liquid replacing means is operable for replacing said treating liquids between treatments of said substrate such that each of said chemicals acting as said first treating liquid is replaced with said deionized water acting as said second treating liquid by supplying said deionized water to said upper position of said treating bath and discharging each chemical from said lower position of said treating bath, said deionized water being replaced with each chemical by supplying each chemical to said upper position of said treating bath and discharging said deionized water from said lower position of said treating bath.

12. A substrate treating apparatus as defined in claim 11, further comprising:

resistivity measuring means for detecting a resistivity of deionized water acting as said treating liquid discharged from said treating bath;

wherein said control means is operable, during a final treatment of said substrate with said deionized water, for monitoring the resistivity of said deionized water discharged from said treating bath, and controlling termination of said final treatment based on said resistivity.

* * * * *